United States Patent
Yoshida

(10) Patent No.: US 6,945,521 B2
(45) Date of Patent: Sep. 20, 2005

(54) FLUID MIXING DEVICE AND CUTTING DEVICE

(75) Inventor: Miki Yoshida, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 10/501,465

(22) PCT Filed: Feb. 6, 2003

(86) PCT No.: PCT/JP03/01237

§ 371 (c)(1),
(2), (4) Date: Jul. 14, 2004

(87) PCT Pub. No.: WO03/082523

PCT Pub. Date: Oct. 9, 2003

(65) Prior Publication Data

US 2005/0051913 A1 Mar. 10, 2005

(30) Foreign Application Priority Data

Mar. 29, 2002 (JP) ........................................ 2002-095194

(51) Int. Cl.⁷ ................................................. B01F 3/04
(52) U.S. Cl. ..................... 261/76; 83/676; 261/DIG. 7; 438/460
(58) Field of Search .................... 261/36.1, 76, DIG. 7, 261/DIG. 75; 438/460, 690; 83/676

(56) References Cited

U.S. PATENT DOCUMENTS

| | | | | |
|---|---|---|---|---|
| 3,256,802 A | * | 6/1966 | Karr | 99/275 |
| 3,313,093 A | * | 4/1967 | Guggenberger et al. | 96/165 |
| 3,583,601 A | * | 6/1971 | Ayers | 222/1 |
| 3,612,495 A | * | 10/1971 | Copping | 261/140.1 |
| 3,756,576 A | * | 9/1973 | Tremolada | 261/35 |
| 4,133,853 A | * | 1/1979 | Ore et al. | 261/140.1 |
| 4,232,700 A | * | 11/1980 | Sutt | 137/93 |
| 4,304,736 A | * | 12/1981 | McMillin et al. | 261/35 |
| 4,596,210 A | * | 6/1986 | Schmidtke | 123/1 A |
| 4,859,376 A | * | 8/1989 | Hancock et al. | 261/35 |
| 5,514,264 A | * | 5/1996 | Shane | 210/96.1 |
| 5,592,867 A | * | 1/1997 | Walsh et al. | 99/323.2 |
| 5,609,798 A | | 3/1997 | Liu et al. | 261/78.2 |
| 6,142,456 A | * | 11/2000 | Machiya et al. | 261/76 |
| 6,158,721 A | | 12/2000 | Katou et al. | 261/26 |
| 6,461,940 B1 | * | 10/2002 | Hasegawa et al. | 438/460 |
| 6,743,722 B2 | * | 6/2004 | Kassir | 438/690 |

FOREIGN PATENT DOCUMENTS

| | | | | |
|---|---|---|---|---|
| EP | 0 370 870 | | 5/1990 | |
| EP | 1 055 445 | | 11/2000 | |
| JP | 62-121694 | * | 6/1987 | ............ 261/DIG. 7 |
| JP | 7-204524 | | 8/1995 | |
| JP | 2001-030170 | | 2/2001 | |

* cited by examiner

Primary Examiner—Richard L. Chiesa
(74) Attorney, Agent, or Firm—Wenderoth, Lind & Ponack, L.L.P.

(57) ABSTRACT

A fluid mixing device (30) used for processing fluid, including a first fluid feed passage (34) for feeding first fluid, a second fluid feed passage (43) for feeding second fluid, and a mixing part (41) for generating mixed fluid by mixing the first fluid with the second fluid, wherein the first fluid feed passage (34) is branched into a first route (37) and a second route (38) through a flow ratio regulating part (36), the second route (38) is branched, at a branch part (39), to a third route (40) with a preset flow ratio, the third route (40) is connected to the mixing part (41), the second fluid feed passage (43) and a fourth route (44) are connected to the mixing part (41), the mixed flow generated by mixing, in the mixing part (41), the first fluid flowing in from the third route (40) with the second fluid flowing in from the second fluid passage (43) flows out to the fourth route (44), the fourth route (44) is merged to the second route (38) on the downstream side of the branch part (39), and the second route (38) is merged to the first route (37), whereby the specific resistant value of the processing fluid can be accurately set to a specified value by an economical method.

7 Claims, 4 Drawing Sheets

FLUID MIXING DEVICE AND CUTTING DEVICE

This application is a national stage of International Application No. PCT/JP03/01237, filed on Feb. 6, 2003.

TECHNICAL FIELD

This invention relates to a fluid mixing apparatus capable of mixing two fluids at a desired mixing ratio, and a cutting apparatus mounted with such a fluid mixing apparatus.

BACKGROUND ART

In various kinds of processing apparatuses, such as a cutting apparatus and a polishing apparatus, a processing operation is carried out with processing water supplied to a work during the processing thereof so as to improve the quality of a processed product. For example, in a cutting apparatus 50 adapted to carry out a cutting operation by making a rotary blade 18, which is rotated at a high speed, cut into a work, for example, a semiconductor wafer W as shown in FIG. 4, cutting water is supplied to inflow portions 23, and a cutting operation is carried out with the cutting water, i.e. processing water supplied from a cutting water supply nozzle 20 to contact portions of the semiconductor wafer W and rotary blade 18. The removing of chips occurring during the cutting operation is also done with the cutting water injected from an injection portion 21 onto the wafer W.

The pure water is used as such cutting water in some cases. However, since the pure water has a high specific resistance value (resistivity), static electricity occurs due to the friction thereof against the semiconductor wafer W, so that the semiconductor wafer W is readily charged. Especially, when the work is a semiconductor wafer W, the quality of a final product lowers greatly due to the loading thereof with the static electricity. Therefore, it is necessary that the occurrence of static electricity be prevented by reducing the specific resistance value of the pure water, and that the wafer W be de-electrified.

Under the circumstances, the occurrence of static electricity is prevented by increasing the specific resistance value of the pure water by mixing carbon dioxide with the pure water, and using the conductivity-increased processing water in practice just as in the processing water generating apparatus disclosed in, for example, JP-A-2001-30170.

On the other hand, when the concentration of the carbon dioxide increases to cause the acidity of the pure water to become high, the rotary blade 18 is corroded to cause the lifetime of the same to lower, or a bonding pad formed on the semiconductor wafer is corroded to cause the quality of a final semiconductor chip to lower. Therefore, in the invention disclosed in the publication referred to above, a means for maintaining the specific resistance value of the pure water at a proper level by controlling a flow rate thereof by regulating a valve is provided.

It has been recognized that, in order to carry out, for example, the cutting of a semiconductor wafer, a proper specific resistance value permitting the prevention of the charging of the work with static electricity and the corroding of the rotary blade and bonding pad is in a very narrow range of 0.5 MΩ.cm to 2.0 MΩ.cm. However, in order to set and maintain the specific resistance value in such a range, it becomes necessary that the flow rate be regulated with a high accuracy by using an expensive fine control valve. Therefore, it is difficult to set the specific resistance value to a desired level. Moreover, an expensive fine control valve has to be used, so that the cost of the apparatus increases to a high level. Such problems are problems encountered in a cutting apparatus, and also problems common to processing apparatuses using processing water.

Consequently, the problem of a processing operation using processing water is to develop a means capable of setting the specific resistance value of the processing water to a desired level by an economical method.

DISCLOSURE OF INVENTION

The present invention constituting a concrete means for solving these problems provides a fluid mixing apparatus adapted to mix a first fluid and a second fluid with each other, including a first fluid supply passage, a second fluid supply passage, and a mixing unit adapted to generate a mixed fluid by mixing the first fluid and second fluid with each other, the first fluid supply passage branching into a first passage and second passage via a flow ratio regulator, the second passage branching at a branching portion thereof into a third passage a flow ratio of which is set in advance, the third passage being connected to the mixing unit, the second fluid supply passage and a fourth passage being connected to the mixing unit, the mixing unit being adapted to send out therefrom a mixed fluid, which is generated in the mixing unit by mixing with each other the first fluid flowing from the third passage and the second fluid flowing from the second fluid supply passage, into the fourth passage, the fourth passage joining the section of the second passage or first passage which is on the downstream side of the branching portion, the second passage joining the first passage.

This fluid mixing apparatus shall have additional necessary conditions of regulating at the branching portion the flow rate of the first fluid flowing in the third passage, in such a manner that the flow rate of this first fluid becomes 1/50 to 1/100 of that of the first fluid flowing in the second passage, and using pure water as the first fluid and carbon dioxide as the second fluid.

According to the fluid mixing apparatus thus formed, a mixed fluid of a desired concentration can be generated with a high accuracy owing to the regulation of the flow rate made in the flow ratio regulator and branching portion even when a valuable fine control valve is not used.

Moreover, when the first and second fluids are pure water and carbon dioxide respectively, the specific resistance value is determined on the basis of the concentration of the carbon dioxide, so that carbonated water having a desired specific resistance value can be generated.

The present invention further provides a cutting apparatus having at least a chuck table retaining a work thereon, a means for cutting the work held on the chuck table, and a fluid mixing unit as mentioned above, wherein the cutting means includes at least a rotary blade for cutting the work held on the chuck table, and a nozzle for supplying cutting water to a portion to be cut of the work, the cutting water supply nozzle sending out the cutting water, which is generated in the fluid mixing unit, to the portion to be cut of the work.

According to the cutting apparatus thus formed, it is possible to generate carbonated water having an optimum specific resistance value, and use this carbonated water as cutting water.

BEST MODE FOR CARRYING OUT THE INVENTION

Figure 1:
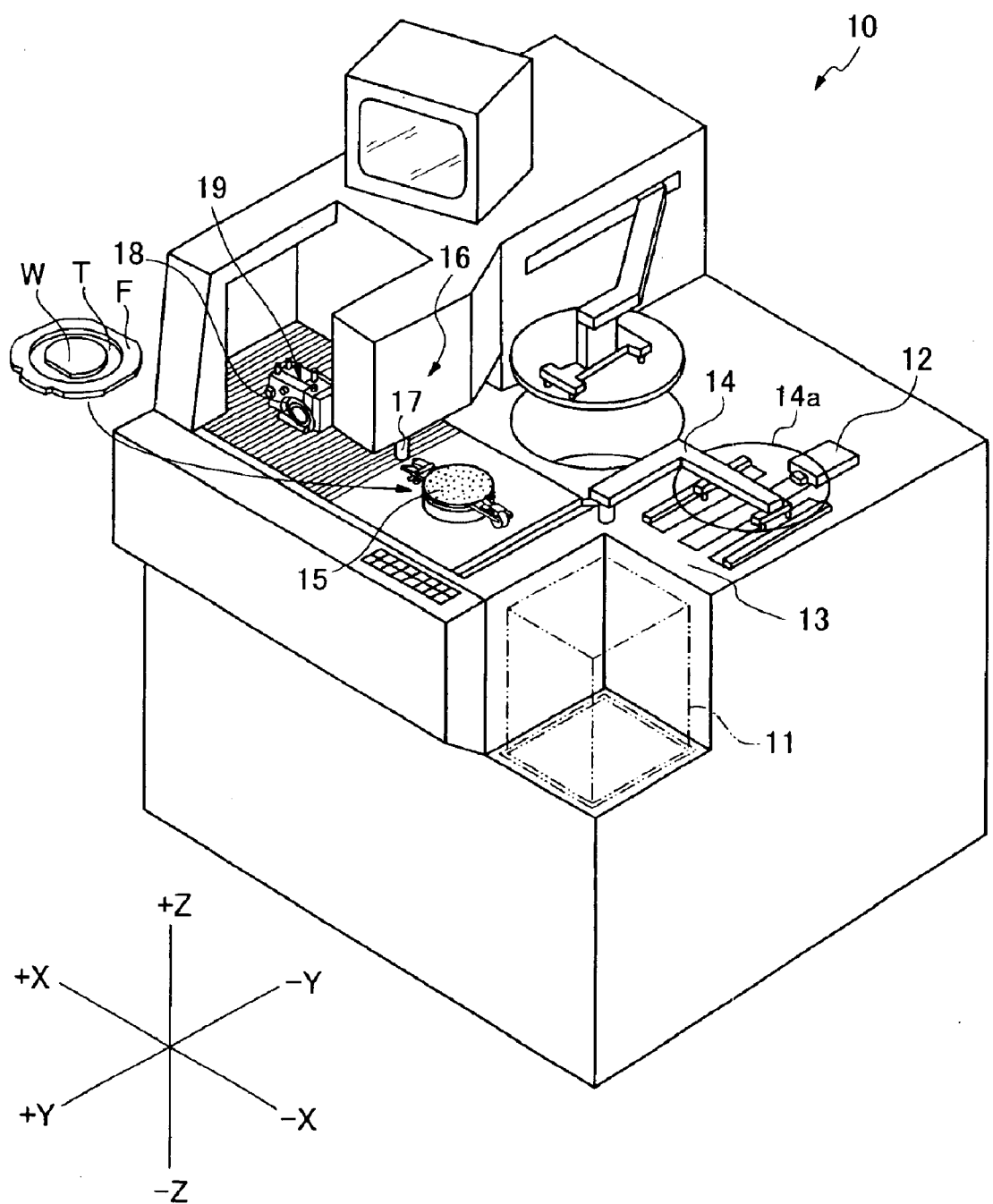
FIG. 1 is a perspective view showing an embodiment of the cutting apparatus according to the present invention.

As a mode of embodiment of the present invention, a fluid mixing apparatus adapted to regulate a specific resistance value of cutting water used in a cutting apparatus 10 shown in FIG. 1 will be described. In the statement of the fluid mixing apparatus, the portions thereof which are formed in the same manner as the corresponding portions of a related art apparatus of this kind will be designated by the same reference numerals.

The cutting apparatus 10 of FIG. 1 is an apparatus for cutting various kinds of plate type materials. For example, in order to dice a semiconductor wafer W, a plurality of semiconductor wafers W each of which is held in a frame F via a holding tape T are stored in a cassette 11.

A carry-out and carry-in means 12 is moved in the +Y direction to hold the semiconductor wafer W, and then in the −Y direction to release the same. The semiconductor wafer W is thus placed on a temporary storage region 13.

The semiconductor wafer W placed on a temporary storage region 13 is sucked to an adsorption member 14a constituting a first transfer means 14, and the adsorption member 14a is then turned and positioned just on the chuck table 15, on which the semiconductor wafer W is released. As a result, the semiconductor wafer W is placed on the chuck table 15 and held thereon in a sucked state.

The chuck table 15 is movable in the X direction. Above a path of a movement of the chuck table 15, an alignment means 16 is provided. This alignment means 16 is provided with an imaging means 17 movable in the Y-axis direction. Owing to the movement in the +X direction of the chuck table 15 and that in the Y direction of the imaging means 17, an outer surface of the semiconductor wafer W is imaged. A key pattern image stored in a memory in advance and an image thus picked up are subjected to a pattern matching process, and a street to be cut can thereby be detected.

A cutting means 19 provided with a rotary blade 18 is formed so as to be integral with the imaging means 17, and these parts are movable in one body in the Y-axis direction. The Y coordinates of the rotary blade 18 are equal to those of the imaging means 17, and both of these parts are positioned on one straight line in the X-axis direction.

Therefore, when a street to be cut is detected by the alignment means 16, the aligning of the street and rotary blade 18 in the Y-axis direction is automatically done. The chuck table 15 holding the semiconductor wafer W is further moved in the +X direction, and the cutting means 19 is moved down with the rotary blade 18 rotated at a high speed, and cuts into a detected street, the mentioned street being thereby cut.

When the cutting operation is carried out with the chuck table 15 moved reciprocatingly in the X-axis direction and with the cutting means 19 index-fed in the Y-axis direction by such a distance at a time that corresponds to an interval of adjacent streets. As a result, all the streets extending in the same direction are cut.

When the cutting operation identical with that described above is carried out after the chuck table 15 is turned 90 degrees, all the streets are cut and diced, so that the semiconductor wafer W is divided into individual semiconductor chips.

Figure 2:
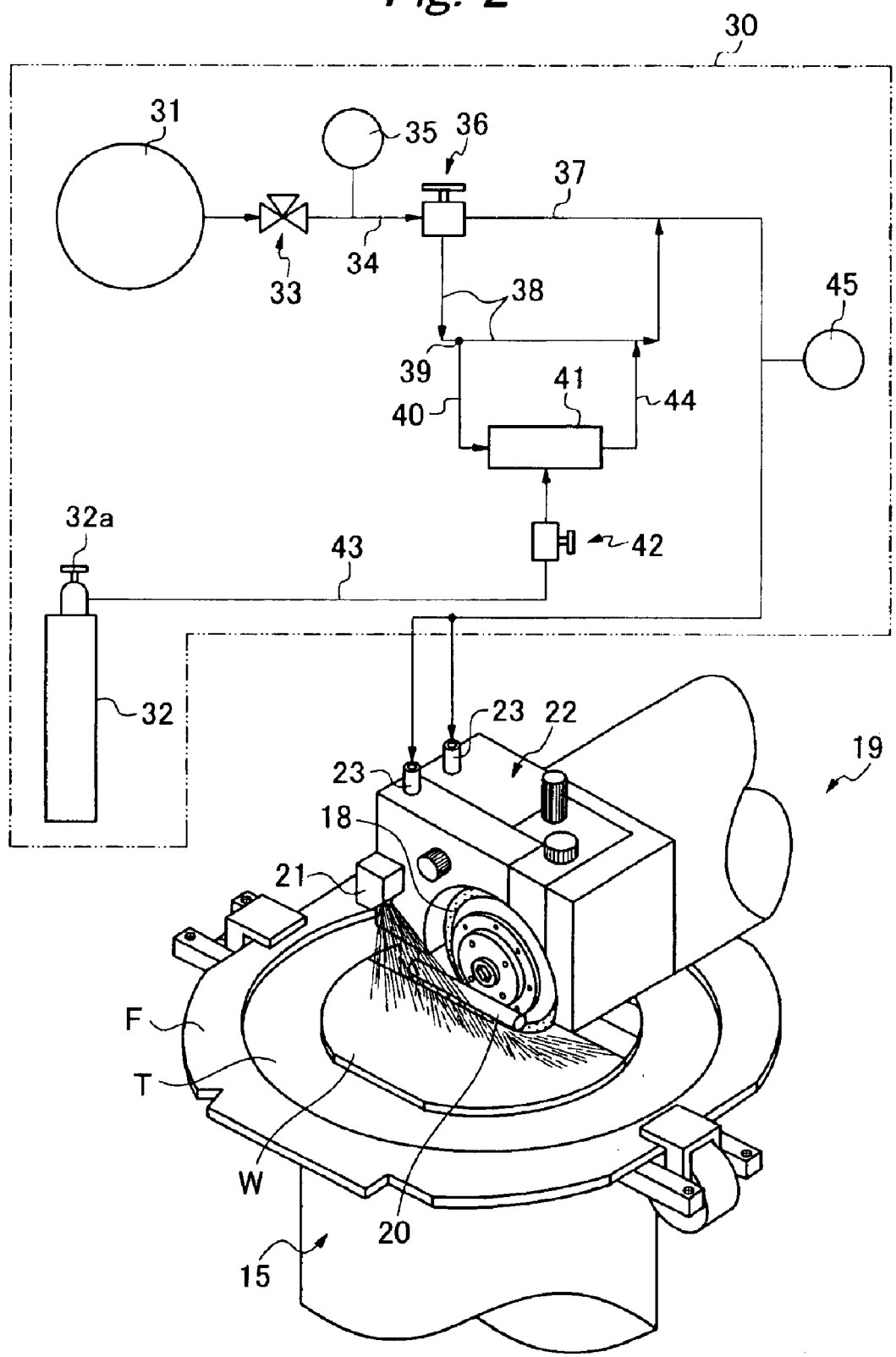
FIG. 2 is an explanatory drawing showing an example of the construction of the fluid mixing apparatus according to the present invention.

During the cutting operation carried out in the above-described manner, cutting water, i.e. cooling processing water is supplied as shown in FIG. 2, from cutting water supply nozzles 20 provided at both sides of the rotary blade 18 to contact portions of the rotary blade 18 and semiconductor wafer W.

On an extension in the X direction of the rotary blade 18, an injection member 21 adapted to inject cutting water is formed, and the injected cutting water removes the stagnant cutting water.

The cutting water flowing out from the cutting water supply nozzle 20 and injection member 21 is generated in a fluid mixing apparatus 30, and flows into a cutting water supply unit via inflow portions 23 provided on an upper portion of a blade cover 22.

The fluid mixing apparatus 30 is provided with a first fluid source 31 storing a first fluid therein, and a second fluid source 32 storing a second fluid therein.

A first fluid supply passage 34 is connected to the first fluid source 31 via a switch valve 33. A flow meter 35 is connected to the first fluid supply passage 34, and adapted to measure the quantity of the first fluid flowing in the first fluid supply passage 34, the opening and closing of the switch valve 33 being able to be regulated on the basis of the quantity mentioned above.

A flow ratio regulator 36 is connected to a downstream side of the first fluid supply passage 34, and a first passage 37 and a second passage 38 are connected to the flow ratio regulator 36. The flow ratio regulator 36 is a valve capable of distributing the first fluid at a desired ratio to the first passage 37 and second passage 38.

The second passage 38 further branches out at a branching portion 39 into a third passage 40. A ratio of the flow rate in the second passage 38 to that in the third passage 40 is set in advance in accordance with, for example, a ratio of an inner diameter of a pipe constituting the second passage 38 to that of a pipe constituting the third passage 40. The flow ratio can be set to a desired level with a high accuracy without using a valve or the like. For example, in this embodiment, the quantity of the first fluid flowing out into the third passage 40 can be regulated to 1/50 to 1/100 of that of the first fluid flowing from the second passage 38.

The third passage 40 is connected to a mixing unit 41, and the first fluid flowing in the third passage 40 flows into the mixing unit 41. A second fluid supply passage 43 is connected to the mixing unit 41 via a pressure regulating valve 42, and the second fluid supply passage 43 is connected to the second fluid source 32.

The second fluid source 32 stores the second fluid therein, and a flow rate of the second fluid is controlled by regulating an operation of a switch valve 32a, the pressure of the same fluid to be sent into the mixing unit 41 can be controlled by regulating an operation of the pressure-regulating valve 42.

In the mixing unit 41, the pure water flowing from the third passage 40 thereinto and the second fluid flowing from the second fluid supply passage 43 thereinto are mixed with each other, and a mixed fluid the concentration of which is in accordance with the quantity of the fluids flowing into the mixing unit 41 is generated.

The mixed fluid generated in the mixing unit 41 flows out into a fourth passage 44. The fourth passage 44 joins the second passage 38 at the downstream side of the branching portion 39, and the fluid in the fourth passage is mixed with the first fluid. The fourth passage 44 may be connected directly to and join the first passage 37 as necessary.

The second passage 38 which the fourth passage 44 joins merges into the first passage 37, in which a mixed fluid with which the first fluid and second fluid are further mixed is generated. The specific resistance value of this mixed fluid can be measured with a specific resistance value meter 45 provided in the first passage 37.

In the following paragraphs, a description will be given by taking as an embodiment a case using pure water as the first fluid stored in the first fluid source 31, carbon dioxide as the second fluid stored in the second fluid source 32, and carbonated water of a specific resistance of 0.5 MΩ, which is obtained by mixing the pure water and carbon dioxide with each other, as cutting water.

The pure water stored in the first fluid source 31 is subjected to the regulation of the flow rate thereof in the switch valve 33, and flows into the flow ratio regulator 36 through the first fluid passage 34. In the flow ratio regulator 36, the quantity of the pure water to flow out therefrom is set so that ⅓ of the quantity of the pure water flowing thereinto flows out into the second passage 38 with the remaining quantity thereof flowing into the first passage 37.

At the branching portion 39, the quantity of the pure water to flow out therefrom is set so that ¹⁄₅₀ out of the quantity of the pure water flowing in the second passage 38 flows into the third passage 40 with the remaining quantity thereof flowing into the second passage 38.

When the flow ratios in the flow ratio regulator 36 and branching portion 39 are set in the above-mentioned manner, the quantity of the pure water flowing from the third passage 40 into the mixing unit 41 becomes ¹⁄₁₅₀ {(⅓)×(¹⁄₅₀)} of that of the pure water flowing in the first fluid supply passage 34.

On the other hand, the second fluid source 32 supplies carbon dioxide to the mixing unit 41, in which carbonated water having a carbon dioxide concentration of 300 ppm is generated by regulating the flow rate of the carbon dioxide in the switch valve 32a.

The generated carbonated water joins the pure water in the second passage 38 via the fourth passage 44, and is mixed therewith. In the second passage 38, the pure water the quantity of which is 49 times as much as that of the carbonated water flows, and the carbonated water is diluted 50 times owing to the confluence of the pure water and carbonated water. As a result, the carbon dioxide concentration becomes 6 ppm {300 ppm×(¹⁄₅₀)}.

The carbonated water, the carbon dioxide concentration of which became 6 ppm owing to the confluence mentioned above, flows in the second passage 38, and joins the pure water in the first passage 37 to be further mixed with the pure water. In the first passage, the pure water the quantity of which is two times as much as that of the carbonated water flowing in the second passage 38 flows, and the carbonated water is diluted three times owing to the confluence thereof and pure water. As a result, the carbon dioxide concentration becomes 2 ppm {6 ppm×(⅓)}.

Figure 3:
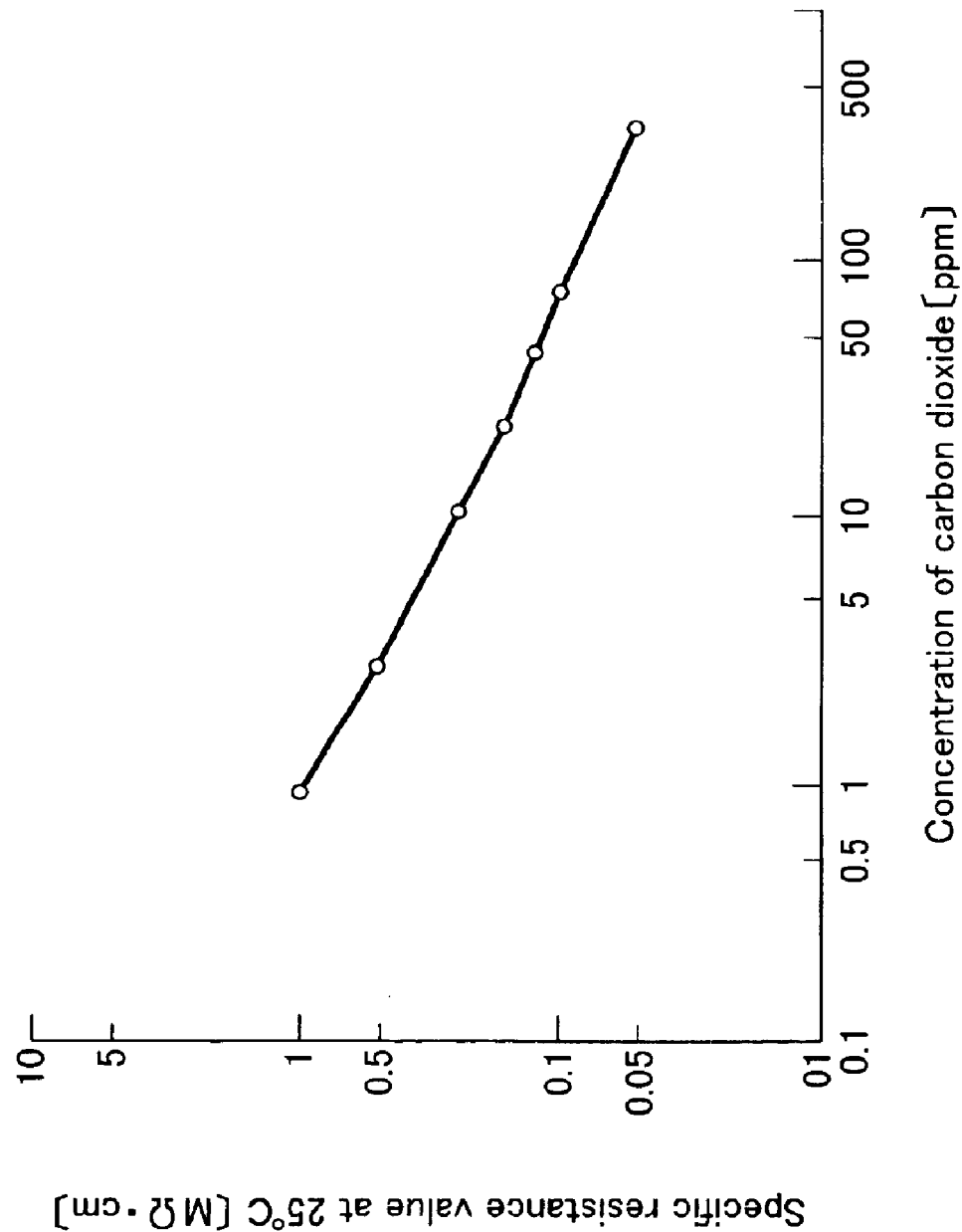
FIG. 3 is a graph showing the relation between the concentration of carbon dioxide and a specific resistance value.
Figure 4:
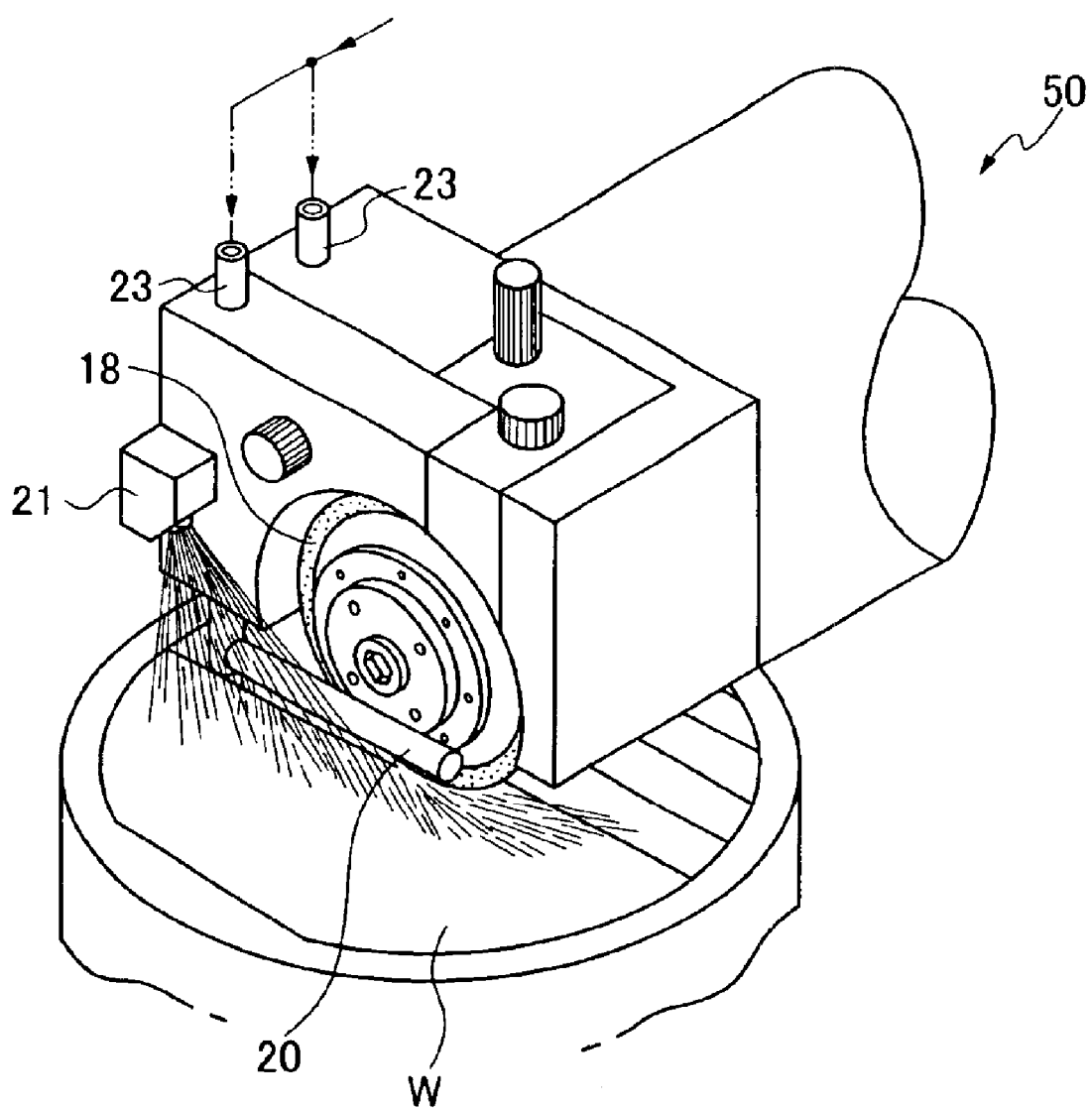
FIG. 4 is a perspective view showing the condition of cutting a semiconductor wafer while supplying the cutting water thereto.

It has been experimentally proved that the relation shown in the graph of FIG. 3 is established between the carbon dioxide concentration of the pure water and the specific resistance value thereof. According to this graph, the specific resistance value is about 0.05 MΩ when the carbon dioxide concentration is 300 ppm.

Therefore, when the carbon dioxide concentration of the carbonated water is reduced from 300 ppm to 2 ppm, the specific resistance value increases from 0.05 MΩ to 0.5 MΩ, and carbonated water of a desired specific resistance value is obtained. This fact can be ascertained by the measurement value on the specific resistance value meter 45.

Thus, a specific resistance value, which could not be attained in the related techniques in which the carbon dioxide concentration finely regulated to ¹⁄₁₅₀ could not be obtained unless an expensive fine control valve was used, can be regulated to a desired level with a high accuracy in the flow ratio regulator 36 made of an inexpensive valve or the like capable of regulating the carbon dioxide concentration to around ⅓.

The carbonated water thus generated flows from the first passage 37 into the cutting water inflow portions 23. The resultant cutting water flows out from the cutting water supply nozzle 20, and is ejected from the injection unit 21. Since this cutting water contains carbon dioxide mixed therewith and has a desired specific resistance value, the cutting water has a suitable level of conductivity. Therefore, static electricity ascribed to the friction between the cutting water and the work rarely occurs, so that the charging of the semiconductor wafer W with static electricity can be prevented. Since the acidity of the cutting water is not too high, the corrosion of the semiconductor wafer W and rotary blade 18 can also be prevented.

In the above embodiment, a case where the cutting water having a specific resistance value of 0.5 MΩ is generated was described but the specific resistance value of the cutting water generated is not limited to this level. For example, when the cutting water the specific resistance value of which is 1 MΩ is generated, the carbon dioxide concentration thereof may become 0.8 ppm as is noted from the graph of FIG. 3.

Therefore, for example, in the flow ratio regulator 36, the quantity of the pure water flowing out therefrom into the second passage 38 is regulated so that the quantity of the pure water becomes ¹⁄₇.₅. Furthermore, in the branching portion 39, the pure water flowing in the second passage 38 is regulated so that ¹⁄₅₀ thereof flows into the mixing unit 41 via the third passage.

When 300 ppm carbonated water is generated in the mixing unit 41 and made to flow out into the fourth passage, the carbon dioxide concentration of the same water becomes ¹⁄₅₀, i.e. 6 ppm when the carbonated water joins the pure water in the second passage 38. Since the second passage 38 joins the first passages 37, the carbon dioxide is further diluted to ¹⁄₇.₅, the carbon dioxide concentration of the cutting water flowing from the first passage 37 into the cutting water inflow portions 23 becomes 0.8 ppm, so that the specific resistance value becomes 1 MΩ.

Thus, in the fluid mixing apparatus 30 shown in FIG. 2, the flow ratio is set to ¹⁄₅₀ in the branching portion 39. Therefore, the fluid mixing apparatus 30 is formed so that, when a rough flow rate regulating operation is carried out in the flow ratio regulator 36, the carbonated water having a desired specific resistance value can be generated. The flow ratio in the branching portion 39 may be set to ¹⁄₁₀₀. The branching portions may be provided in not smaller than three positions, and flow ratios may be set in the respective branching portions. The first fluid and second fluid are not limited to the pure water and carbon dioxide respectively.

In this mode of embodiment, a case where the fluid mixing apparatus 30 is mounted on the cutting apparatus 10 to generate cutting water has been described. This embodiment can also be applied to a case where processing water used in other processing apparatus is generated. For example, in an apparatus for grinding the surface of a semiconductor wafer, it is necessary that the grinding water be supplied to the contact surfaces of a grinding stone and a semiconductor wafer so as to improve the grinding quality, and this grinding water can also be generated by using the fluid mixing apparatus 30.

INDUSTRIAL APPLICABILITY

As described above, according to the fluid mixing apparatus of the present invention, a mixed fluid of a desired concentration can be generated with a high accuracy owing to the highly accurate regulation of a flow rate in the flow ratio regulator and branching portion even when an expensive fine control valve is not used. This enables the cost of the apparatus to be reduced.

When the first and second fluids are pure water and carbon dioxide respectively, the specific resistance value is determined on the basis of the carbon dioxide concentration. Therefore, carbonated water having a desired specific resistance value, and optimum processing water for a processing operation can be generated.

Further, according to the fluid mixing apparatus of the present invention, carbon dioxide is mixed with pure water, and carbonated water having an optimum specific resistance value is thereby generated. Since this carbonated water can be used as cutting water, it is possible to prevent the occurrence of static electricity during a cutting operation, carry out the removal of the electricity, and prevent the corrosion of the rotary blade and a work without accompanying a rise in the processing cost.

What is claimed is:

1. A fluid mixing apparatus adapted to mix a first fluid and a second fluid with each other, characterized in that the apparatus includes a first fluid supply passage, a second fluid supply passage, and a mixing unit for mixing the first fluid and second fluid with each other to generate a mixed fluid, the first fluid supply passage branching out into a first passage and a second passage via a flow ratio regulator, the second passage branching out at a branching portion thereof into a third passage in which a flow ratio is set in advance, the third passage being connected to the mixing unit, the second fluid supply passage and a fourth passage being connected to the mixing unit, a mixed fluid generated by mixing with each other in the mixing unit the first fluid flowing from the third passage thereinto and the second fluid flowing from the second fluid supply passage thereinto being made to flow out into the fourth passage, the fourth passage joining the second passage or the first passage which is on the downstream side of the branching portion, the second passage joining the first passage.

2. A fluid mixing apparatus according to claim 1, wherein quantity of the first fluid flowing in the third passage is regulated in the branching portion so that the quantity of the first fluid flowing in the third passage becomes $\frac{1}{50}$ to $\frac{1}{100}$ of that of the first fluid flowing in the second passage.

3. A fluid mixing apparatus according to claim 2, wherein the first fluid is pure water, and the second fluid is carbon dioxide.

4. A cutting apparatus characterized in that the apparatus is provided with at least a chuck table holding a work thereon, a cutting means for cutting a work held on the chuck table, and such a fluid mixing apparatus as is defined in claim 2, wherein the cutting means being provided with at least a rotary blade for cutting the work held on the chuck table, and a nozzle for supplying cutting water to a position for cutting the work, the nozzle being adapted to supply therefrom the cutting water, which is generated by the fluid mixing apparatus, to the work cutting position.

5. A fluid mixing apparatus according to claim 1, wherein the first fluid is pure water, and the second fluid is carbon dioxide.

6. A cutting apparatus characterized in that the apparatus is provided with at least a chuck table holding a work thereon, a cutting means for cutting a work held on the chuck table, and such a fluid mixing apparatus as is defined in claim 5, wherein the cutting means being provided with at least a rotary blade for cutting the work held on the chuck table, and a nozzle for supplying cutting water to a position for cutting the work, the nozzle being adapted to supply therefrom the cutting water, which is generated by the fluid mixing apparatus, to the work cutting position.

7. A cutting apparatus characterized in that the apparatus is provided with at least a chuck table holding a work thereon, a cutting means for cutting a work held on the chuck table, and such a fluid mixing apparatus as is defined in claim 1, wherein the cutting means being provided with at least a rotary blade for cutting the work held on the chuck table, and a nozzle for supplying cutting water to a position for cutting the work, the nozzle being adapted to supply therefrom the cutting water, which is generated by the fluid mixing apparatus, to the work cutting position.

* * * * *